United States Patent
Du et al.

(10) Patent No.: US 12,244,284 B2
(45) Date of Patent: Mar. 4, 2025

(54) TUNABLE FILTER AND METHOD FOR MANUFACTURING THE SAME

(71) Applicants: Beijing BOE Sensor Technology Co., Ltd., Beijing (CN); BOE Technology Group Co., Ltd., Beijing (CN)

(72) Inventors: Guochen Du, Beijing (CN); Zhenyu Xie, Beijing (CN); Shan Chang, Beijing (CN); Chiachiang Lin, Beijing (CN)

(73) Assignees: BEIJING BOE SENSOR TECHNOLOGY CO., LTD., Beijing (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 17/907,295

(22) PCT Filed: Oct. 28, 2021

(86) PCT No.: PCT/CN2021/127136
§ 371 (c)(1),
(2) Date: Sep. 26, 2022

(87) PCT Pub. No.: WO2022/222405
PCT Pub. Date: Oct. 27, 2022

(65) Prior Publication Data
US 2024/0213946 A1 Jun. 27, 2024

(30) Foreign Application Priority Data
Apr. 23, 2021 (CN) .......................... 202110439246.9

(51) Int. Cl.
*H03H 7/01* (2006.01)

(52) U.S. Cl.
CPC ........ *H03H 7/0153* (2013.01); *H03H 7/0115* (2013.01)

(58) Field of Classification Search
CPC .......... H03H 7/00; H03H 7/01; H03H 7/0153; H03H 7/0107; H03H 7/0115
(Continued)

(56) References Cited

U.S. PATENT DOCUMENTS 9,203,373 B2 * 12/2015 Zuo .......................... H05K 1/165
9,634,640 B2 * 4/2017 Zuo ....................... H03H 7/0115

FOREIGN PATENT DOCUMENTS

CN 101036228 A 9/2007
CN 104919702 A 9/2015
(Continued)

*Primary Examiner* — Hai L Nguyen
(74) *Attorney, Agent, or Firm* — Nath, Goldberg & Meyer; Joshua B. Goldberg

(57) ABSTRACT

The present disclosure provides an adjustable filter and a method for manufacturing the same, and belongs to the technical field of electronics. The tunable filter includes: a base substrate having a first surface and a second surface opposite to each other in a thickness direction of the base substrate; wherein the base substrate is provided with first connecting vias extending through the base substrate along the thickness direction of the base substrate; and at least one inductor and at least one capacitor integrated on the base substrate; wherein each of the at least one inductor includes first sub-structures on the first surface, second sub-structures on the second surface, and first connection electrodes in the first connecting vias, and the first connection electrodes connect the first sub-structures to the second sub-structures, respectively, to form a coil structure of the inductor.

20 Claims, 5 Drawing Sheets

(58) Field of Classification Search
USPC .......................... 333/172, 174–176, 178–185
See application file for complete search history.

(56) References Cited

FOREIGN PATENT DOCUMENTS

| | | |
|---|---|---|
| CN | 105191123 A | 12/2015 |
| CN | 105308862 A | 2/2016 |
| CN | 109411469 A | 3/2019 |
| CN | 111130459 A | 5/2020 |

* cited by examiner

TUNABLE FILTER AND METHOD FOR MANUFACTURING THE SAME

This is a National Phase Application filed under 35 U.S.C. 371 as a national stage of PCT/CN2021/127136, filed Oct. 28, 2021, an application claiming the benefit of Chinese Application No. 202110439246.9, filed Apr. 23, 2021, the content of each of which is hereby incorporated by reference in its entirety.

TECHNICAL FIELD

The present disclosure relates to the technical field of electronics, and particularly relates to a tunable filter and a method for manufacturing a tunable filter.

BACKGROUND

Recently, the consumer electronics industry is developing day by day, mobile communication terminals represented by mobile phones, particularly 5G mobile phones, are developing rapidly, the frequency bands of signals to be processed by the mobile phones are increasing, the number of required radio frequency chips is also rising. The mobile phones which are popular for the consumers are developing continuously towards miniaturization, lightness, thinness and long battery life. In a traditional mobile phone, a large number of discrete devices such as resistors, capacitors, inductors, filters and the like are disposed on a radio frequency print circuit board (PCB), since the discrete devices have disadvantage such as a large volume, high power consumption, lots of welding spots, and a large change for parasitic parameters, the mobile phone is difficult to meet future requirements. The interconnection, matching and the like between the radio frequency chips require integrated passive devices with a small area, a high performance and a good consistency. The integrated passive devices currently on the market are mainly silicon-based (Si-based) substrates and gallium arsenide-based (GaAs-based) substrates. The Si-based integrated passive device has advantages such as a low cost and the like, but the Si-based integrated passive device has a high microwave loss due to trace impurities (i.e., poor insulation) inside the Si, as a result, the Si-based integrated passive device has a poor performance. The GaAs-based integrated passive device has advantages such as excellent performance and the like, but the GaAs-based integrated passive device is expensive.

SUMMARY

The present invention is directed to at least one of the technical problems in the prior art, and provides a tunable filter and a method for manufacturing the same.

The embodiment of the present disclosure provides a tunable filter, including: a base substrate having a first surface and a second surface opposite to each other in a thickness direction of the base substrate; wherein the base substrate is provided with first connecting vias extending through the base substrate along the thickness direction of the base substrate; and at least one inductor and at least one capacitor on the base substrate; wherein each of the at least one inductor includes first sub-structures on the first surface, second sub-structures on the second surface, and first connection electrodes in the first connecting vias, and the first sub-structures are connected to the second sub-structures by the first connection electrodes, respectively.

The at least one capacitor includes a first capacitor and a second capacitor; the at least one inductor includes one inductor; the second capacitor includes a first plate and a second plate sequentially arranged along a direction away from the base substrate, and a P-type semiconductor layer, an intrinsic semiconductor layer and an N-type semiconductor layer stacked between the first plate and the second plate; and a first lead terminal of the inductor is connected to a first signal terminal, and a second lead terminal of the inductor is connected to a second signal terminal and a first plate of the first capacitor; a second plate of the first capacitor is connected to the second plate of the second capacitor and a first bias voltage terminal; and the first plate of the second capacitor is connected to a second bias voltage terminal.

The second sub-structures of the inductor, the first plate of the first capacitor, and the first plate of the second capacitor are arranged in the same layer and are made of the same material; and/or the first plate of the first capacitor and the second plate of the second capacitor are arranged in the same layer and made of the same material.

A first interlayer dielectric layer is arranged on a side of the second plate of the second capacitor away from the base substrate, and the first signal terminal, the second signal terminal, the first bias voltage terminal, and the second bias voltage terminal are arranged on a side of the first interlayer dielectric layer away from the base substrate; and the first signal terminal is connected to the first lead terminal of the inductor through a second connecting via extending through the first interlayer dielectric layer; the second signal terminal is connected to the second plate of the second capacitor through a third connecting via extending through the first interlayer dielectric layer; the first bias voltage terminal is connected to the second plate of the second capacitor through a fourth connecting via extending through the first interlayer dielectric layer; and the second bias voltage terminal is connected to the first plate of the second capacitor through a fifth connecting via extending through the first interlayer dielectric layer.

The tunable filter further includes a first connection pad, a second connection pad, a third connection pad, and a fourth connection pad on a side of a layer, where the first signal terminal, the second signal terminal, the first bias voltage terminal, and the second bias voltage terminal are located, away from the base substrate; and the first connection pad covers a side of the first signal terminal away from the base substrate; the second connection pad covers a side of the second signal terminal away from the base substrate; the third connection pad covers a side of the first bias voltage terminal away from the base substrate; the fourth connection pad covers a side of the second bias voltage terminal away from the base substrate.

The at least one inductor includes a first inductor and a second inductor; the at least one capacitor includes a third capacitor and a fourth capacitor; the tunable filter includes a first resonant unit, a second resonant unit, a first switching transistor, a second switching transistor and a third switching transistor; wherein the first resonant unit includes the first inductor and the third capacitor; the second resonant unit includes the second inductor and the fourth capacitor; and a first lead terminal of the first inductor is connected to a third signal terminal, and a second lead terminal of the first inductor is connected to a first plate of the third capacitor; a second plate of the third capacitor is connected to a first electrode of the first switching transistor; a second electrode of the first switching transistor is connected to a fourth signal terminal; a control electrode of the first switching transistor is connected to a first control signal terminal and a first electrode of the second switching transistor; a second electrode of the second switching transistor is connected to a reference voltage terminal; a control electrode of the second switching transistor is connected to a second control signal terminal and a control electrode of the third switching transistor; a first electrode of the third switching transistor is connected to the second plate of the third capacitor; a second electrode of the third switching transistor is connected to a second plate of the fourth capacitor; a first plate of the fourth capacitor is connected to a second lead terminal of the second inductor; and a first lead terminal of the second inductor is connected to a fifth signal terminal.

Second sub-structures of the first inductor, second sub-structures of the second inductor, the first plate of the third capacitor, the first plate of the fourth capacitor, the first and second electrodes of the first switching transistor, the first and second electrodes of the second switching transistor, and the first and second electrodes of the third switching transistor are arranged in the same layer and are made of the same material; and/or the second plate of the third capacitor, the second plate of the fourth capacitor, the control electrode of the first switching transistor, the control electrode of the second switching transistor and the control electrode of the third switching transistor are arranged in the same layer and are made of the same material.

A first interlayer dielectric layer is arranged on a side of the second plate of the second capacitor away from the base substrate, and the third signal terminal, the fourth signal terminal, and the fifth signal terminal and the first control signal terminal and the second control signal terminal are arranged on a side of the first interlayer dielectric layer away from the base substrate; and the third signal terminal is connected to the first lead terminal of the first inductor through a sixth connecting via extending through the first interlayer dielectric layer; the fourth signal terminal is connected to the second plate of the third capacitor through a seventh connecting via extending through the first interlayer dielectric layer; the fifth signal terminal is connected to the first lead terminal of the second inductor through an eighth connecting via extending through the first interlayer dielectric layer; the first control signal terminal is connected to the control electrode of the first switching transistor through a ninth connecting via extending through the first interlayer dielectric layer; and the second control signal terminal is connected to the control electrode of the second switching transistor and the control electrode of the third switching transistor through a tenth connecting via extending through the first interlayer dielectric layer.

The tunable filter further includes a fifth connection pad, a sixth connection pad, a seventh connection pad, an eighth connection pad, and a ninth connection pad on a side of a layer, where the third signal terminal, the fourth signal terminal, the fifth signal terminal, the first control signal terminal, and the second control signal terminal are located, away from the base substrate; and the fifth connection pad covers a side of the third signal terminal away from the base substrate; the sixth connection pad covers a side of the fourth signal terminal away from the base substrate; the seventh connection pad covers a side of the fifth signal terminal away from the base substrate; the eighth connection pad covers a side of the first control signal terminal away from the base substrate; and the ninth connection pad covers a side of the second control signal terminal away from the base substrate.

The base substrate includes a glass substrate.

The embodiment of the present disclosure provides a method for manufacturing a tunable filter, including: preparing a base substrate such that the base substrate is provided with a first surface and a second surface opposite to each other in a thickness direction of the base substrate; wherein the base substrate is provided with first connecting vias extending through the base substrate along the thickness direction of the base substrate; and forming at least one inductor and at least one capacitor on the base substrate; wherein forming each of the at least one inductor includes: forming first sub-structures of the inductor on the first surface, second sub-structures of the inductor on the second surface, and first connection electrodes in the first connecting vias such that the first sub-structures are respectively connected to the second sub-structures by the first connection electrodes, to form a coil structure of the inductor.

DETAIL DESCRIPTION OF EMBODIMENTS

In order to enable one of ordinary skill in the art to better understand the technical solutions of the present disclosure, the present invention will be described in further detail with reference to the accompanying drawings and the detailed description.

Unless defined otherwise, technical or scientific terms used herein shall have the ordinary meaning as understood by one of ordinary skill in the art to which the present disclosure belongs. The terms "first", "second", and the like used in the present disclosure are not intended to indicate any order, quantity, or importance, but rather are used for distinguishing one element from another. Further, the term "a", "an", "the", or the like used herein does not denote a limitation of quantity, but rather denotes the presence of at least one element. The term of "comprising", "including", or the like, means that the element or item preceding the term contains the element or item listed after the term and its equivalent, but does not exclude other elements or items. The term "connected", "coupled", or the like is not limited to physical or mechanical connections, but may include electrical connections, whether direct or indirect connections. The terms "upper", "lower", "left", "right", and the like are used only for indicating relative positional relationships, and when the absolute position of an object being described is changed, the relative positional relationships may also be changed accordingly.

Figure 1:
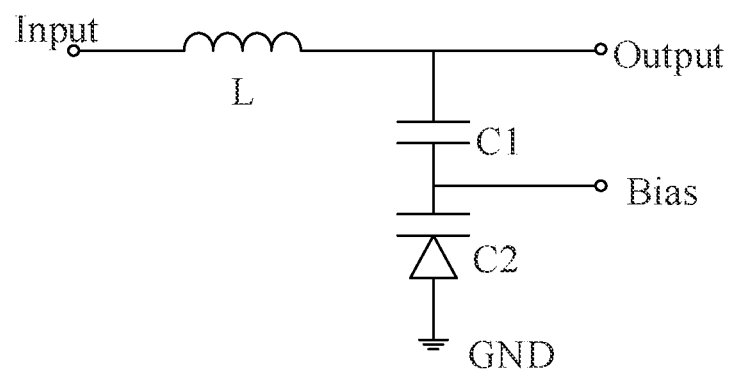
FIG. 1 is a circuit diagram of a tunable filter according to an embodiment of the present disclosure.

The embodiment of the present disclosure provides a tunable filter and a method for manufacturing the same, wherein the tunable filter may be a low pass filter, a high pass filter, a band pass filter, a band stop filter, a duplexer, or the like. It follows that the tunable filter includes at least a capacitor and an inductor L. The capacitor allows high-frequency signals to pass through and blocks low-frequency signals from passing through; the inductor L allows low-frequency signals to pass through and blocks high-frequency signals from passing through. FIG. 1 is a circuit diagram of a tunable filter according to an embodiment of the present disclosure; as shown in FIG. 1, the tunable filter is a low pass filter, including a first signal terminal, a second signal terminal, a first bias voltage terminal Bias, a second bias voltage terminal, an inductor L, a first capacitor C1, and a second capacitor C2; the first signal terminal is used as a signal input terminal Input, and the second signal terminal is used as a signal output terminal Output. The second capacitor C2 is an adjustable capacitor, for example: the adjustable capacitor includes a first plate, a second plate, a P-type semiconductor, an intrinsic semiconductor and an N-type semiconductor sequentially stacked between the first plate and the second plate. In this case, the capacitor may be adjusted by controlling a bias voltage applied to the first plate and the second plate.

Specifically, a first lead terminal 22 of the inductor L is connected to the signal input terminal Input, a second lead terminal 23 of the inductor L is connected to a first plate 31 of the first capacitor C1, a second plate 32 of the first capacitor C1 is connected to the second plate 32 of the second capacitor C2 and the first bias voltage terminal Bias, and the first plate 31 of the second capacitor C2 is connected to the second bias voltage terminal. In the embodiment of the present disclosure, as an example, the second bias voltage terminal is the ground terminal GND. In this case, a capacitance of the second capacitor C2 may be changed by only changing a voltage input to the first bias voltage terminal Bias, so as to implement the function of adjusting a frequency of the filter.

In order to make the specific structure of the tunable filter shown in FIG. 1 clear, layers of the tunable filter will be described. The inductor L, the first capacitor C1, and the second capacitor C2 in the tunable filter are integrated on a base substrate. For example: the inductor L adopts a snake-shaped coil and is formed on the base substrate; the first plate 31 of the first capacitor C1 and the first plate 31 of the second capacitor C2 may be disposed in the same layer as the inductor L and made of the same material as the inductor L. The P-type semiconductor layer, the intrinsic semiconductor layer and the N-type semiconductor layer are sequentially formed on a side of the first plate 31 of the second capacitor C2 away from the base substrate; and an interlayer dielectric layer is formed on a side of the first plate 31 of the first capacitor C1 away from the base substrate. The second plate 32 of the first capacitor C1 is formed on a side of the interlayer dielectric layer away from the base substrate, and the interlayer dielectric layer is used as an intermediate medium between the first plate 31 and the second plate of the first capacitor C1. The second plate 32 of the second capacitor C2 is formed on the side of the N-type semiconductor layer away from the base substrate. A first interlayer dielectric layer 40 is formed on a side of the second plate 32 of the first capacitor C1 and the second plate 32 of the second capacitor C2 away from the base substrate; the signal input terminal Input, the signal output terminal Output, the first bias voltage terminal Bias and the ground terminal GND are formed on a side of the first interlayer dielectric layer 40 away from the base substrate; the signal input terminal Input is connected to the first lead terminal 22 of the inductor L through a second connecting via 41 extending through the first interlayer dielectric layer 40; the signal output terminal Output is connected to the second plate 32 of the second capacitor C2 and the inductor L through a third connecting via 42 extending through the first interlayer dielectric layer 40, and the first bias voltage terminal Bias is connected to the second plate 32 of the second capacitor C2 through a fourth connecting via 43 extending through the first interlayer dielectric layer 40; the ground terminal GND is connected to the first plate 31 of the second capacitor C2 through a fifth connecting via 44 extending through the first interlayer dielectric layer 40. Alternatively, the tunable filter in the embodiment of the present disclosure may further include a first connection pad 51, a second connection pad 52, a third connection pad 53, and a fourth connection pad 54 formed on a side of a layer, where the signal input terminal Input, the signal output terminal Output, the first bias voltage terminal Bias, and the second bias voltage terminal are located, away from the base substrate; the first connection pad 51 covers a side of the signal input terminal Input away from the base substrate; the second connection pad 52 covers a side of the signal output terminal Output away from the base substrate; the third connection pad 53 covers a side of the first bias voltage terminal Bias away from the base substrate; the fourth connection pad 54 covers a side of the ground terminal GND away from the base substrate.

In some examples, the base substrate includes, but is not limited to, any one of a glass substrate 10, a flexible base, and an interlayer dielectric layer including at least an organic insulating layer. Passive devices are integrated on the glass substrate 10, which has advantages of small size, light weight, high performance, low power consumption, and the like, so that the base substrate in the embodiment of the present disclosure is preferably the glass substrate 10. Hereinafter, a transparent medium layer is the glass substrate 10 as an example.

Figure 2:
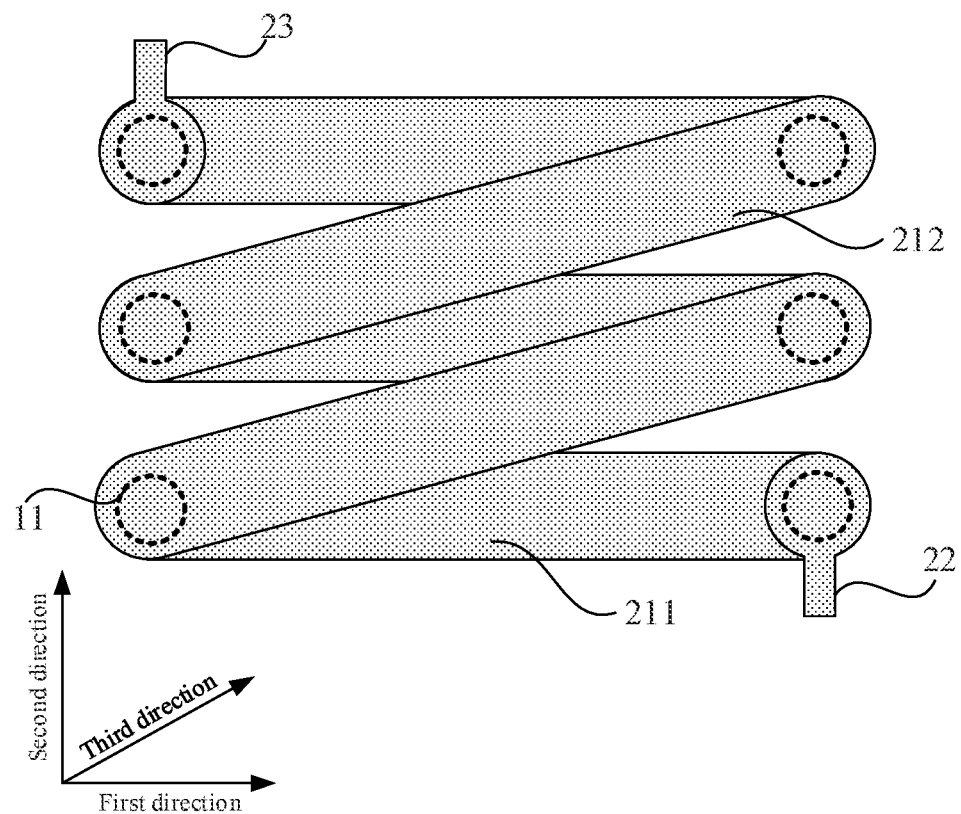
FIG. 2 is a top view of an inductor according to an embodiment of the present disclosure.

In some examples, to implement a filter with a small size, the glass substrate 10 may be processed to form a three-dimensional inductor L to reduce a size of the filter. For example: FIG. 2 is a top view of an inductor L according to an embodiment of the present disclosure; referring to FIG. 2, first sub-structures 211 of the inductor L extend along a first direction and are arranged side by side along a second direction; second sub-structures 212 of the inductor L extend along a third direction and are arranged side by side along the second direction. The first direction, the second direction and the third direction are different from each other. In the embodiment of the present disclosure, the first direction and the second direction are perpendicular to each other, and the first direction and the third direction intersect with each other and non-perpendicular to each other. Alternatively, extending directions of the first sub-structure 211 and the second sub-structure 212 may be interchanged, which are within the protection scope of the embodiments of the present disclosure. In addition, in the present embodiment, the inductor L includes N first sub-structures 211 and N-1 second sub-structures 212 as an example, where N≥2, and N is an integer. Orthographic projections of a first terminal and a second terminal of each first sub-structure 211 on the glass substrate 10 at least partially overlap an orthographic projection of a first connecting via 11 on the glass substrate 10, respectively. The first terminal and the second terminal of one first sub-structure 211 correspond to different first connecting vias 11, i.e. an orthographic projection of one first sub-structure 211 on the glass substrate 10 at least partially overlaps in orthographic projection of two first connecting vias 1111 on the glass substrate 10. At this time, a first terminal of an ith second sub-structure 212 of the inductor L is connected to a first terminal of an ith first sub-structure 211 and a second terminal of an (i+1)-th first sub-structure 211 to form a coil of the inductor L, where 1≤i≤N−1, and i is an integer.

It should be noted that the first lead terminal 22 is connected to a second terminal of a first one of first sub-structures 211 of the coil of the inductor L, and the second lead terminal 23 is connected to a first terminal of an Nth first sub-structure 211. Further, the first lead terminal 22 and the second lead terminal 23 may be disposed in the same layer as the second sub-structures 212 and made of the same material as the second sub-structures 212. The first lead terminal 22 may be connected to the second terminal of the first one of first sub-structures 211 through the first connecting via 11, and correspondingly, the second lead terminal 23 may be connected to the first terminal of the Nth first sub-structure 211 through the first connecting via 11.

Figure 3:
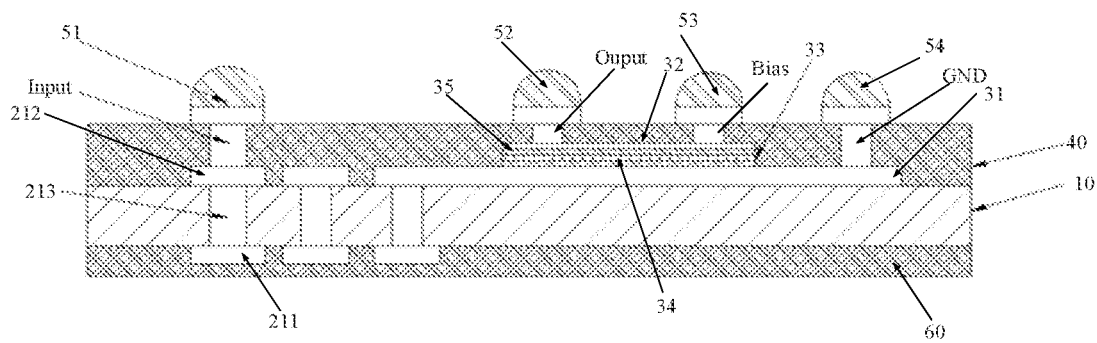
FIG. 3 is a cross-sectional view of the tunable filter shown in FIG. 1.

FIG. 3 is a cross-sectional view of a low pass filter shown in FIG. 2. As shown in FIG. 3, the first sub-structures 211 in the inductor L of the low pass filter are arranged on a first surface of the glass substrate 10 and the second sub-structures 212 are arranged on a second surface of the glass substrate 10. The first capacitor C1 and the second capacitor C2 of the low pass filter are also arranged on the second surface.

For example: the second sub-structures 212 of the coil of the inductor L are disposed in the same layer as the first plate 31 of the first capacitor C1 and the first plate 31 of the second capacitor C2, and are made of the same material as the first plate 31 of the first capacitor C1 and the first plate 31 of the second capacitor C2. The P-type semiconductor layer, the intrinsic semiconductor layer and the N-type semiconductor layer are sequentially formed on a side of the first plate 31 of the second capacitor C2 away from the base substrate, and the interlayer dielectric layer is formed on a side of the first plate 31 of the first capacitor C1 away from the base substrate. The second plate 32 of the first capacitor C1 is formed on a side of the interlayer dielectric layer away from the base substrate, and the interlayer dielectric layer is used as an intermediate medium between the first plate 31 and the second plate of the first capacitor C1. The second plate 32 of the second capacitor C2 is formed on a side of the N-type semiconductor layer away from the base substrate. The first interlayer dielectric layer 40 is formed on a side of the second plate 32 of the first capacitor C1 and the second plate 32 of the second capacitor C2 away from the base substrate; the signal input terminal Input, the signal output terminal Output, the first bias voltage terminal Bias and the ground terminal GND are formed on a side of the first interlayer dielectric layer 40 away from the base substrate; the signal input terminal Input is connected to the first lead terminal 22 of the inductor L through the second connecting via 41 extending through the first interlayer dielectric layer 40; the signal output terminal Output is connected to the second plate 32 of the second capacitor C2 and the inductor L through the third connecting via 42 extending through the first interlayer dielectric layer 40; and the first bias voltage terminal Bias is connected to the second plate 32 of the second capacitor C2 through the fourth connecting via 43 extending through the first interlayer dielectric layer 40; the ground terminal GND is connected to the first plate 31 of the second capacitor C2 through the fifth connecting via 44 extending through the first interlayer dielectric layer 40. Alternatively, the tunable filter in the embodiment of the present disclosure may further include the first connection pad 51, the second connection pad 52, the third connection pad 53, and the fourth connection pad 54 formed on a side of the layer, where the signal input terminal Input, the signal output terminal Output, the first bias voltage terminal Bias, and the second bias voltage terminal are located, away from the base substrate. The first connection pad 51 covers a side of the signal input terminal away from the base substrate; the second connection pad 52 covers a side of the signal output terminal Output away from the base substrate; the third connection pad 53 covers a side of the first bias voltage terminal Bias away from the base substrate; the fourth connection pad 54 covers a side of the ground terminal GND away from the base substrate.

In addition, in the tunable filter according to the embodiment of the present disclosure, because the P-type semiconductor layer, the intrinsic semiconductor layer, and the N-type semiconductor layer are disposed between the first plate and the second plate of the capacitor, a magnitude of the bias voltage applied to the first plate and the second plate may be controlled, so as to realize the tuning effect of the capacitor, and thus, to realize the frequency tunable function of the filter. For example: the greater the capacitance of the capacitor is, the stronger the blocking of low frequency signals is.

In order to make the structure of the low pass filter shown in FIG. 3 clear, it will be described in conjunction with the method for manufacturing the low pass filter. It should be noted that FIG. 3 only illustrates the structures of the second capacitor C2 and the inductor L, not the first capacitor C1. The first plate 31 of the first capacitor C1 and the first plate 31 of the second capacitor C2 are formed through a one-step patterning process; and the second plate 32 of the first capacitor C1 and the second plate 32 of the second capacitor C2 are formed through a one-step patterning process, so in the following description, only the processes of forming the inductor L and the second capacitor C2 are described.

Figure 4:
FIG. 4 is a schematic diagram of a structure formed in step S11 in a method for manufacturing a tunable filter according to the embodiment of the present disclosure.

A method for manufacturing the low pass filter shown in FIG. 3 specifically includes the following steps:

S11, Providing a glass substrate 10, and forming a first connecting via 11 on the glass substrate 10 in a thickness direction thereof and extending through the glass substrate 10, as shown in FIG. 4.

In some examples, the first connecting via 11 on the glass substrate 10 may be formed by means including, but not limited to, mechanical drilling, laser drilling, photolithographic drilling, or the like. The process of forming the first connecting via 11 will be described below by taking the laser drilling as an example.

In some examples, step S11 may specifically include the following steps:

(1) Cleaning: cleaning the glass substrate 10 in a cleaning machine.

In some examples, the glass substrate 10 has a thickness of about 0.1 mm to 1.1 mm.

(2) Laser drilling: vertically irradiating a laser beam onto a surface of the glass substrate 10 by using a laser, to form a plurality of first connecting vias 11 on the glass substrate 10. Specifically, when the laser beam interacts with the glass substrate 10, atoms in the glass substrate 10 are ionized and projected out of the surface of the glass substrate 10 due to the high energy of photons of the laser, and the drilled via is gradually deepened along with time, until the whole glass substrate 10 is penetrated. That is, the plurality of first connecting vias 11 are formed. The laser may have a wavelength selected from 532 nm, 355 nm, 266 nm, 248 nm, or 197 nm, etc., the laser may have a pulse width selected from 1 fs to 100 fs, 1 ps to 100 ps, or Ins to 100 ns, etc., and a type of the laser may be a continuous laser, or a pulse laser, etc. The laser drilling may include, but is not limited to, the following two modes. The first mode is that when a light spot has a large diameter, a relative position between the laser beam and the glass substrate 10 is fixed, the glass substrate 10 is directly penetrated by means of the high energy of the laser beam, a shape of the formed first connecting via 11 is an inverted truncated cone, which has diameters sequentially reducing from top to bottom (from the second surface to the first surface). The second mode is that when the diameter of the light spot is small, the laser beam moves (scans) in circles on the glass substrate 10. Specifically, a focal point of the light spot is constantly changed, a depth of the focal point is constantly changed, the laser beam moves in a spiral line from a lower surface (a first surface) to an upper surface (a second surface) of the glass substrate 10, and radiuses of the spiral line are gradually reduced from the lower surface to the upper surface. In this way, a portion of the glass substrate 10 is obtained through the laser cut and is truncated cone shaped, and falls down due to the gravity, thereby forming the first connecting via 11 which is truncated cone shaped.

In some examples, the first connecting via 11 has an aperture of about 10 μm to 1 mm.

(3) HF etching: a stress region is formed in a region of about 5 to 20 μm and near a hole on an upper surface of an inner wall of the first connecting via 11 during the laser drilling, the surface roughness of the glass substrate 10 in the region shows burrs in a melting state, and a large number of micro-cracks and macro-cracks are present, and residual stress is present. At this time, 2% to 20% of HF etching liquid is used, a wet etching is carried out for a certain time at a proper temperature, the glass in the stress region is etched, so that the interior of the first connecting via 11 and the region on the surface of the first connecting via 11 close to the hole is smooth and flat, the micro-cracks and macro-cracks are absent, and the stress region is completely etched away.

Figure 5:
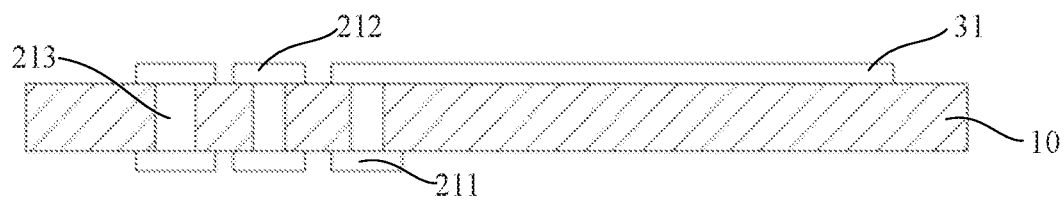
FIG. 5 is a schematic diagram of a structure formed in step S12 in a method for manufacturing a tunable filter according to the embodiment of the present disclosure.

S12, forming first sub-structures 211 of a coil of an inductor L on the first surface of the glass substrate 10 after the step S11, forming second sub-structures 212 and a first plate 31 of a second capacitor C2 on the second surface, and first connection electrodes 213 in the first connecting vias 11, as shown in FIG. 5.

In some examples, step S12 may specifically include the following steps:

(1) Growing a seed layer: a first metal film is deposited as an electroplating seed layer on the first surface of the glass substrate 10 through a magnetron sputtering process. In the process, the first metal film is deposited on the inner wall of the first connecting via 11, and then the glass substrate 10 is turned over, and the first metal film may be formed on the second surface of the glass substrate 10 through a magnetron sputtering process. Alternatively, the first metal film on the second surface also serves as an electroplating seed layer.

In some examples, the material of the first metal film includes, but is not limited to, at least one of copper (Cu), aluminum (Al), molybdenum (Mo), and silver (Ag), and a thickness of the first metal film is about 100 nm to 500 nm, and further may be about 50 nm to 35 μm. In the following description, the material of the first metal film is copper as an example.

In some examples, to increase the adhesion of the first metal film to the glass substrate 10, an auxiliary metal film may be formed on the first and second surfaces of the glass substrate 10 by means including, but not limited to, magnetron sputtering before depositing the first metal film. The auxiliary metal film is made of at least one of nickel (Ni), molybdenum (Mo) alloy and titanium (Ti) alloy, such as MoNb, and has a thickness of about 2 nm to 20 nm.

(2) Electroplating and hole filling: putting the glass substrate 10 on a carrier of an electroplating machine, pressing an energizing pad thereon, putting the entirety (including the glass substrate 10 and the energizing pad) into a hole filling electroplating bath (a special hole filling electrolyte is used in the bath), applying a current, wherein the electroplating liquid is kept continuously and rapidly flowing on the surfaces of the glass substrate 10, electrons are obtaining from cations in the electroplating liquid on the inner wall of the first connecting via 11, thereby forming atoms to be deposited on the inner wall; metal copper is deposited mainly in the first connecting via at a high speed (the deposition speed is 0.5 to 3 μm/min) through the special hole filling electrolyte with special proportion, wherein the first surface and the second surface of the glass substrate 10 are flat, and the deposition speed of the metal copper on the two surfaces is extremely low (0.005 to 0.05 μm/min). With the increase of time, the metal copper on the inner wall of the first connecting via gradually grows thick, and even the first connecting via 1111 may be completely filled, that is, a connection part of the coil of the inductor L is formed (that is, a spiral region of the inductor L is prepared), and finally, the glass is taken out and deionized water cleaning is performed on the glass.

(3) Patterning the metal on the first surface: turning over the glass substrate 10 (with the first surface facing upwards), performing photoresist coating, exposure and development on the metal copper layer on the first surface, then performing wet etching on the copper, removing the photoresist by stripping after etching, so that patterning of the metal on the first surface is completed, thereby forming the first sub-structures 211 of the coil of the inductor L on the first surface.

(4) Patterning the metal on the second surface: turning over the glass substrate 10 (with the second surface facing upwards), performing photoresist coating, exposure and development on the metal copper layer on the second surface, then performing wet etching on the copper, removing the photoresist by stripping after etching, so that patterning of the metal on the second surface is completed, thereby forming the second sub-structures 212 of the coil 21 of the inductor L and the first plate 31 of the second capacitor C2 on the second surface.

In some examples, after patterning the metal on the first surface of (3) and before patterning the metal on the second surface of (4) in the step S12, the step S12 further includes: forming a first protective layer 60 on the first surface of the glass substrate 10 with the formed first sub-structures 211 of the coil of the inductor L, to prevent the first sub-structures 211 from being oxidized due to exposure.

A material of the first protective layer 60 is an inorganic insulating material. For example: the first protective layer 60 is an inorganic insulating layer formed of silicon nitride (SiNx), or an inorganic insulating layer formed of silicon oxide ($SiO_2$), or a stacked and combined layer including the SiNx inorganic insulating layer and $SiO_2$ inorganic insulating layer.

Figure 6:
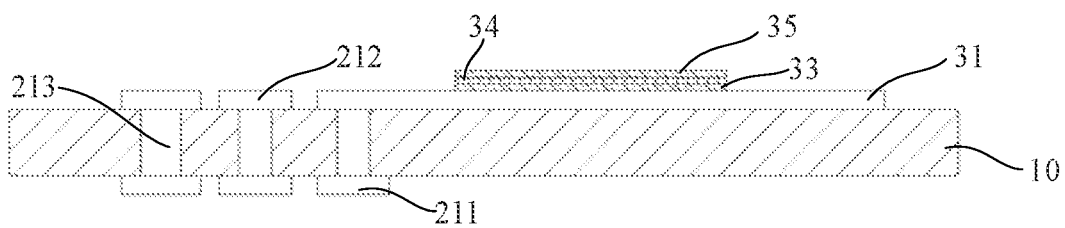
FIG. 6 is a schematic diagram of a structure formed in step S13 in a method for manufacturing a tunable filter according to the embodiment of the present disclosure.

S13, forming a P-type semiconductor layer, an intrinsic semiconductor layer, an N-type semiconductor layer, and a second plate of the second capacitor C2 on the glass substrate 10 after the step S12, as shown in FIG. 6.

In some examples, step S13 may include sequentially depositing the P-type semiconductor film, the intrinsic semiconductor film, the N-type semiconductor film, and the second metal film on a side of the first plate 31 of the second capacitor C2 away from the glass substrate 10, performing photoresist coating, exposure and development, then performing wet etching, and removing the photoresist by stripping, thereby forming a pattern including the P-type semiconductor layer, the intrinsic semiconductor layer, the N-type semiconductor layer, and the second plate of the second capacitor C2. In some examples, a material of the second metal film may be the same as that of the first metal film, and thus is not described herein again. A material of the P-type semiconductor film may be P-amorphous silicon, a material of the intrinsic semiconductor film may be amorphous silicon, and a material of the N-type semiconductor film may be N-amorphous silicon.

Figure 7:
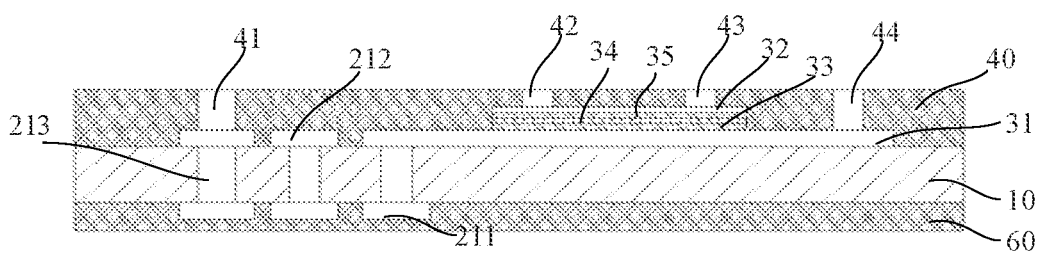
FIG. 7 is a schematic diagram of a structure formed in step S14 in a method for manufacturing a tunable filter according to the embodiment of the present disclosure.

S14, forming a first interlayer dielectric layer 40 on the glass substrate 10 after the step S13, and forming a second connecting via 41, a third connecting via 42, a fourth connecting via 43, and a fifth connecting via 44 extending through the first interlayer dielectric layer 40, as shown in FIG. 7. The second connecting via 41 is used to connect the first lead terminal 22 of the coil of the inductor L to a signal input terminal to be formed; the third connecting via 42 is used to connect the second plate 32 of the second capacitor C2 to a signal output terminal Output to be formed; the fourth connecting via 43 is used to connect the second plate 32 of the second capacitor C2 to a first bias voltage line to be formed; the fifth connecting via 44 is used to connect the first plate 31 of the second capacitor C2 to the ground terminal GND to be formed.

In some examples, step S14 may include forming the first interlayer dielectric layer 40 on the side of the second plate 32 of the second capacitor C2 away from the glass substrate 10 through a plasma enhanced chemical vapor deposition (PECVD), then performing photoresist coating, exposure and development, then performing dry etching, and removing the photoresist by stripping, to obtain the second connecting via 41, the third connecting via 42, the fourth connecting via 43, and the fifth connecting via 44.

The first interlayer dielectric layer 40 is made of an inorganic insulating material. For example: the first interlayer dielectric layer 40 is an inorganic insulating layer formed of silicon nitride (SiNx), or an inorganic insulating layer formed of silicon oxide ($SiO_2$), or a stacked and combined layer including the SiNx inorganic insulating layer and $SiO_2$ inorganic insulating layer.

S15, forming a signal input terminal Input, a signal output terminal Output, a first bias voltage terminal Bias and a ground terminal GND on the glass substrate 10 after the step S14; wherein the signal input terminal Input is connected to a first lead terminal 22 of the coil of the inductor L through the second connecting via 41; the signal output terminal Output is connected to the second plate 32 of the second capacitor C2 through the third connecting via 42; the first bias voltage line is connected to the second plate 32 of the second capacitor C2 through the fourth connecting via; the ground terminal GND is connected to the first plate 31 of the second capacitor C2 through the fifth connecting via 44, as shown in FIG. 3.

In some examples, step S15 may include depositing a third metal film through a magnetron sputtering, performing photoresist coating, exposure, development, performing wet etching, and removing the photoresist by stripping after etching, to form a pattern including the signal input terminal Input, the signal output terminal Output, the first bias voltage terminal Bias, and the ground terminal GND. A material of the third metal film may be the same as that of the first metal film, and thus is not described herein again.

S16, forming a first connection pad 51, a second connection pad 52, a third connection pad 53, and a fourth connection pad 54 on the glass substrate 10 after the step S15. The first connection pad 51 covers the signal input terminal Input, the second connection pad 52 covers the signal output terminal Output, the third connection pad 53 covers the first bias voltage terminal Bias, and the fourth connection pad 54 covers the ground terminal GND, as shown in FIG. 3.

In some examples, the first connection pad 51, the second connection pad 52, the third connection pad 53, and the fourth connection pad 54 include, but are not limited to, solder.

Thus, the preparation of the low pass filter is completed.

Figure 8:
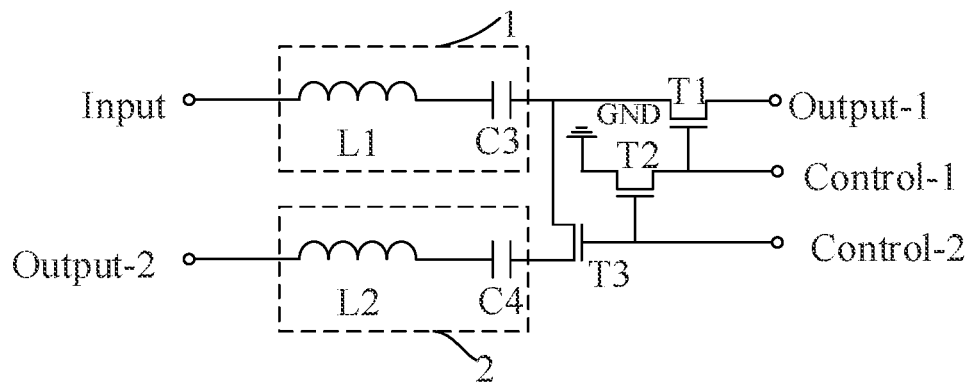
FIG. 8 is a circuit diagram of another tunable filter according to the embodiment of the present disclosure.

FIG. 8 is a circuit diagram of another tunable filter in accordance with an embodiment of the present disclosure. As shown in FIG. 8, the filter includes a third signal terminal, a fourth signal terminal, a fifth signal terminal, a first control signal terminal, a second control signal terminal, a first tuning unit, a second tuning unit, a first switching transistor T1, a second switching transistor T2, and a third switching transistor T3. The third signal terminal is used as the signal input terminal Input, the fourth signal terminal is used as a first signal input terminal Input, the fifth signal terminal is used as a second signal output terminal Output2, and a reference signal terminal may be the ground terminal GND. The first tuning unit includes a first inductor L1 and a third capacitor C3, and is configured for selecting a main frequency signal; the second tuning unit includes a second inductor L2 and a fourth capacitor C4, and is configured to select a variable frequency signal in coordination with the first resonant unit.

It should be noted that the transistors used in the embodiments of the present disclosure may be thin film transistors or field effect transistors or other devices with the same characteristics. Source and drain electrodes of each transistor are symmetrical, so that the source and drain electrodes are equal to each other. In the embodiments of the present disclosure, to distinguish the source electrode and the drain electrode of the transistor, one of the electrodes is referred to as a first electrode, the other electrode is referred to as a second electrode, and a gate electrode is referred to as a control electrode. In addition, the transistors may be divided into N-type and P-type transistors according to the characteristics of the transistors. In the following embodiments, the transistors are the N-type transistors, as an example. When the N-type transistors are used, the first electrode is the source electrode of the N-type transistor, and the second electrode is the drain electrode of the N-type transistor. When a high level signal is input to the gate electrode, the source electrode and the drain electrode are conducted. When the P-type transistors are used, the first electrode is the drain electrode of the P-type transistor, the second electrode is the source electrode of the P-type transistor. When a low level signal is input to the gate electrode, the source electrode and the drain electrode are conducted. It is contemplated that the implementation adopting the P-type transistors will be readily apparent to one skilled in the art without inventive effort, which is within the scope of the embodiment of the present disclosure. In the embodiment of the present disclosure, since the transistor is an N-type transistor, an operating level signal in the embodiment of the present disclosure refers to a high level signal, and a non-operating level signal refers to a low level signal.

Specifically, with continued reference to FIG. 8, in the tunable filter, the first lead terminal 22 of the first inductor L1 is connected to the signal input terminal Input, and the second lead terminal 23 of the first inductor L1 is connected to a first plate 31 of the third capacitor C3; a second plate 32 of the third capacitor C3 is connected to a source electrode of the first switching transistor T1; a drain electrode of the first switching transistor T1 is connected to the first signal output terminal Output1; a gate electrode of the first switching transistor T1 is connected to the first control signal terminal and a source electrode of the second switching transistor T2; a drain electrode of the second switching transistor T2 is connected to the ground terminal GND; a gate electrode of the second switching transistor T2 is connected to the second control signal terminal and a gate electrode 103 of the third switching transistor T3; a source electrode of the third switching transistor T3 is connected to the second plate 32 of the third capacitor C3; a drain electrode of the third switching transistor T3 is connected to a second plate 32 of the fourth capacitor C4; a first plate 31 of the fourth capacitor C4 is connected to a second lead terminal 23 of the second inductor L2; a first lead terminal 22 of the second inductor L2 is connected to the second signal output terminal Output2.

For example: when a high level signal is input to the first control signal terminal and a low level signal is input to the second control signal terminal, the first switching transistor T1 is turned on, and the second switching transistor T2 and the third switching transistor T3 are turned off; the signal input by the signal input terminal Input is output through the first signal output terminal Output1 via the first resonant unit (the first inductor L1 and the third capacitor C3). When a high level signal is input to the second control signal terminal and a low level signal is input to the first control signal terminal, the second switching transistor T2 and the third switching transistor T3 are turned on, and the first switching transistor T1 is turned off; at this time, the signal input by the signal input terminal Input is output through the second output terminal via the first tuning unit (the first inductor L1 and the third capacitor C3) and the second tuning unit (the second inductor L2 and the fourth capacitor C4), so that the selection of the variable frequency signal is realized.

In order to make the specific structure of the filter be understood, each layer of the specific structure of the filter is described below. The first inductor L1 and the third capacitor C3 in the first resonant unit of the filter, and the second inductor L2 and the fourth capacitor C4 in the second resonant unit; the first switching transistor T1, the second switching transistor T2, and the third switching transistor T3 may all be integrated on the glass substrate 10. For example: the first inductor L1 and the second inductor L2 both adopt a snake-shaped coil and are disposed on the glass substrate 10, the first plate 31 of the third capacitor C3 and the first plate 31 of the fourth capacitor C4 may be disposed in the same layer as the first inductor L1 and the second inductor L2, and may be made of the same material as the first inductor L1 and the second inductor L2, and the source electrode and the drain electrode 81 of the first switching transistor T1, the source electrode and the drain electrode 82 of the second switching transistor T2, and the source electrode and the drain electrode 83 of the third switching transistor T3 may also be disposed in this layer. A second interlayer dielectric layer, an active layer 91 of the first switching transistor T1, an active layer 92 of the second switching transistor T2 and an active layer 93 of the third switching transistor T3 are formed on a side of the first plate 31 of the third capacitor C3 and the first plate 31 of the fourth capacitor C4 away from the glass substrate 10. The second plate 32 of the third capacitor C3, the second plate 32 of the fourth capacitor C4, the gate electrode of the first switching transistor T1, the gate electrode of the second switching transistor T2 and the gate electrode 103 of the third switching transistor T3 are formed on a side of the second interlayer dielectric layer away from the glass substrate 10. The first interlayer dielectric layer 40 is formed on a side of a layer, where the second plate 32 of the third capacitor C3, the second plate 32 of the fourth capacitor C4, the gate electrode of the first switching transistor T1, the gate electrode of the second switching transistor T2 and the gate electrode 103 of the third switching transistor T3 are located, away from the glass substrate 10. The signal input terminal Input, the first signal output terminal Output1, the second signal output terminal Output2, the first control signal terminal and the second control signal terminal are formed on a side of the first interlayer dielectric layer 40 away from the glass substrate 10; the signal input terminal Input is connected to the first lead terminal 22 of the first inductor L1 through a sixth connecting via extending through the first interlayer dielectric layer 40; the first signal output terminal Output1 is connected to the second plate 32 of the third capacitor C3 through a seventh connecting via extending through the first interlayer dielectric layer 40; the second signal output terminal Output2 is connected to the first lead terminal 22 of the second inductor L2 through an eighth connecting via extending through the first interlayer dielectric layer 40; the first control signal terminal is connected to the gate electrode of the first switching transistor T1 through a ninth connecting via extending through the first interlayer dielectric layer 40; the second control signal terminal is connected to the gate electrode of the second switching transistor T2 and the gate electrode 103 of the third switching transistor T3 through a tenth connecting via extending through the first interlayer dielectric layer 40. A fifth connection pad 55, a sixth connection pad 56, a seventh connection pad 57, an eighth connection pad 58 and a ninth connection pad 59 are on the side of the layer, where the signal input terminal Input, the first signal output terminal Output1, the second signal output terminal Output2, the first control signal terminal and the second control signal terminal are located, away from the glass substrate 10; the fifth connection pad 55 covers a side of the signal input terminal Input away from the base substrate; the sixth connection pad 56 covers a side of the first signal output terminal Output1 away from the base substrate; the seventh connection pad 57 covers a side of the second signal output terminal Output2 away from the base substrate; the eighth connection pad 58 covers a side of the first control signal terminal away from the base substrate; the ninth connection pad 59 covers a side of the second control signal terminal away from the base substrate.

Figure 9A:
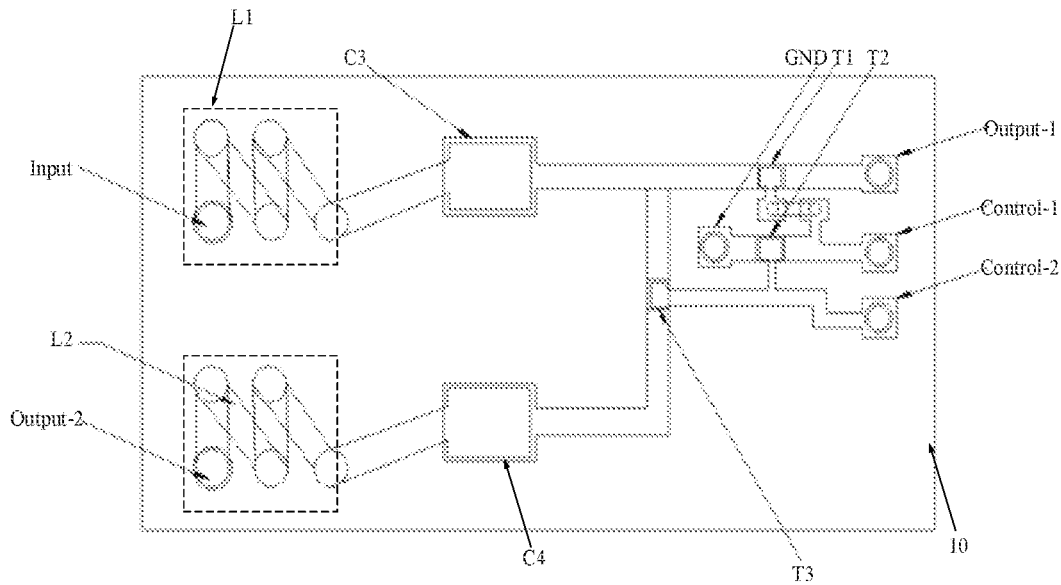
FIG. 9a is a layout of the tunable filter shown in FIG. 8.
Figure 9B:
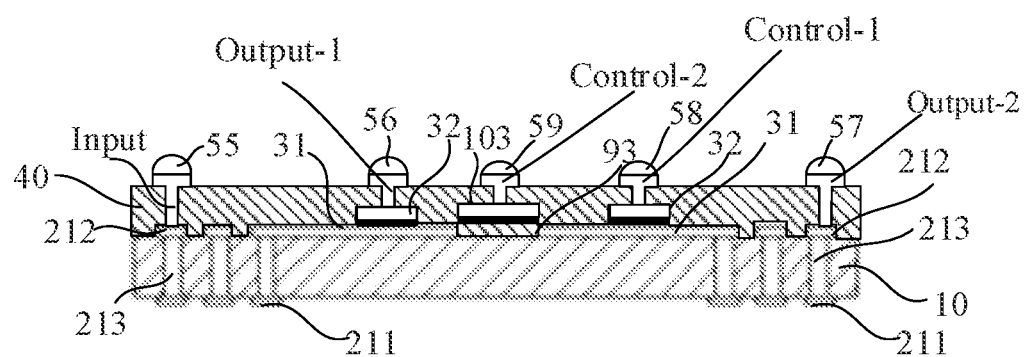
FIG. 9b is a cross-sectional view of the tunable filter shown in FIG. 8.

In some examples, to implement a filter having a small size, the glass substrate 10 may be processed to form a three-dimensional inductor L to reduce the size of the filter. That is, the first inductor L1 and the second inductor L2 in the filter may also adopt the structure of FIG. 2, that is, the three-dimensional inductor L. FIG. 9*a* is a layout of the tunable filter shown in FIG. 8; FIG. 9*b* is a cross-sectional view of the tunable filter shown in FIG. 8; as shown in FIGS. 9*a* and 9*b*, the glass substrate 10 has the first connecting via 11 extending through the glass substrate 10 in a thickness direction of the glass substrate 10. Each of the first inductor L1 and the second inductor L2 includes first sub-structures 211 disposed on the first surface of the glass substrate 10, second sub-structures 212 disposed on the second surface, and first connection electrodes 213 disposed in the first connecting vias 11. The first plate 31 of the third capacitor C3 and the first plate 31 of the fourth capacitor C4 may be disposed in the same layer as the second sub-structures 212 of the first inductor L1 and the second sub-structures 212 of the second inductor L2, and made of the same material as the second sub-structures 212 of the first inductor L1 and the second sub-structures 212 of the second inductor L2. The source electrode and the drain electrode 81 of the first switching transistor T1, the source electrode and the drain electrode 82 of the second switching transistor T2, and the source electrode and the drain electrode 83 of the third switching transistor T3 may also be disposed in this layer. The second interlayer dielectric layer, the active layer 91 of the first switching transistor T1, the active layer 92 of the second switching transistor T2 and the active layer 93 of the third switching transistor T3 are formed on a side of the first plate 31 of the third capacitor C3 and the first plate 31 of the fourth capacitor C4 away from the glass substrate 10. The second plate 32 of the third capacitor C3, the second plate 32 of the fourth capacitor C4, the gate electrode of the first switching transistor T1, the gate electrode of the second switching transistor T2 and the gate electrode 103 of the third switching transistor T3 are formed on a side of the second interlayer dielectric layer away from the glass substrate 10. The first interlayer dielectric layer 40 is formed on a side of the second plate 32 of the third capacitor C3, the second plate 32 of the fourth capacitor C4, the gate electrode of the first switching transistor T1, the gate electrode of the second switching transistor T2 and the gate electrode 103 of the third switching transistor T3 away from the glass substrate 10. The signal input terminal Input, the first signal output terminal Output1, the second signal output terminal Output2, the first control signal terminal and the second control signal terminal are formed on a side of the first interlayer dielectric layer 40 away from the glass substrate 10; the signal input terminal Input is connected to the first lead terminal 22 of the first inductor L1 through the sixth connecting via extending through the first interlayer dielectric layer 40; the first signal output terminal Output1 is connected to the second plate 32 of the third capacitor C3 through the seventh connecting via extending through the first interlayer dielectric layer 40; the second signal output terminal Output2 is connected to the first lead terminal 22 of the second inductor L2 through the eighth connecting via extending through the first interlayer dielectric layer 40; the first control signal terminal is connected to the gate electrode of the first switching transistor T1 through the ninth connecting via extending through the first interlayer dielectric layer 40; the second control signal terminal is connected to the gate electrode of the second switching transistor T2 and the gate electrode 103 of the third switching transistor T3 through the tenth connecting via extending through the first interlayer dielectric layer 40. The fifth connection pad 55, the sixth connection pad 56, the seventh connection pad 57, the eighth connection pad 58 and the ninth connection pad 59 are on the side of the layer, where the signal input terminal Input, the first signal output terminal Output1, the second signal output terminal Output2, the first control signal terminal and the second control signal terminal are located, away from the glass substrate 10; the fifth connection pad 55 covers a side of the signal input terminal Input away from the base substrate; the sixth connection pad 56 covers a side of the first signal output terminal Output1 away from the base substrate; the seventh connection pad 57 covers a side of the second signal output terminal Output2 away from the base substrate; the eighth connection pad 58 covers a side of the first control signal terminal away from the base substrate; the ninth connection pad 59 covers a side of the second control signal terminal away from the base substrate.

In order to make the structure of the tunable filter shown in FIG. 8 clear, a method for manufacturing such filter will be described below.

Figure 10A:
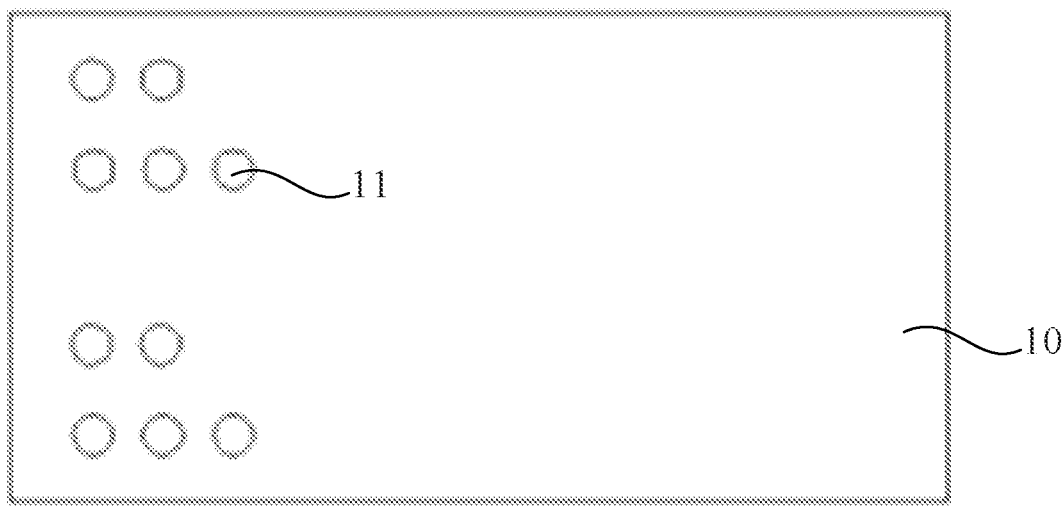
FIG. 10a is a layout formed in step S21 in another method for manufacturing a tunable filter according to the embodiment of the present disclosure.
Figure 10B:
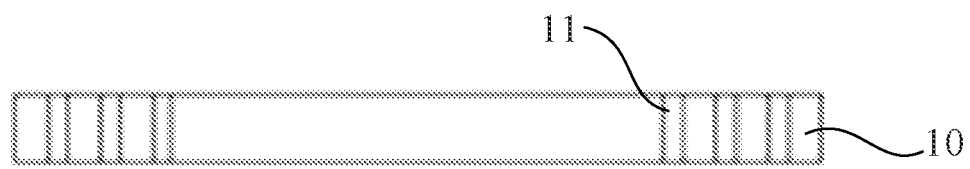
FIG. 10b is a schematic diagram of a structure formed in step S21 in another method for manufacturing a tunable filter according to the embodiment of the present disclosure.

S21, Providing a glass substrate 10, and forming a first connecting via 11 on the glass substrate 10 in a thickness direction thereof and extending through the glass substrate 10, as shown in FIGS. 10*a* and 10*b*.

In some examples, step 21 may be performed in the same manner as step S11, and thus, the description thereof is not repeated herein.

Figure 11A:
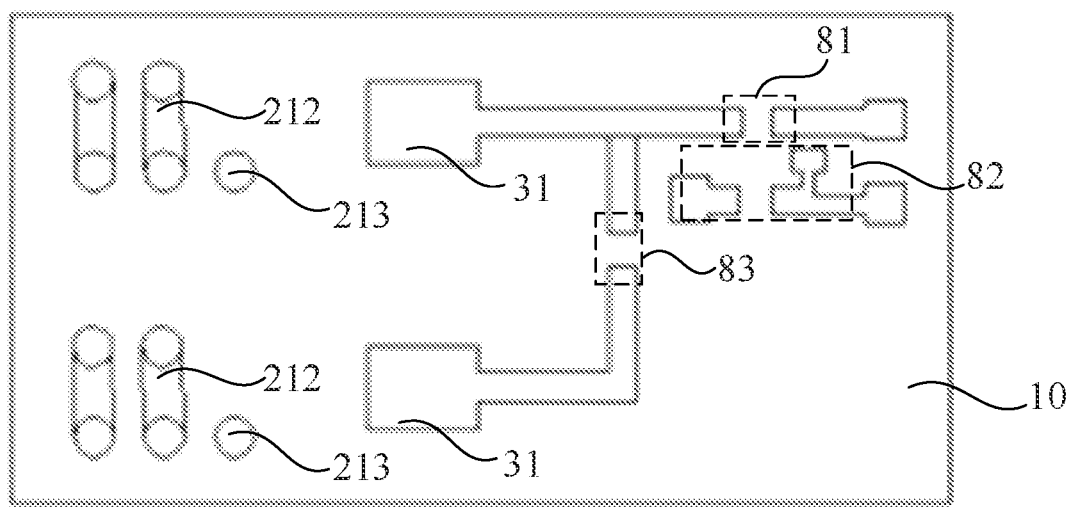
FIG. 11a is a layout formed in step S22 in another method for manufacturing a tunable filter according to the embodiment of the present disclosure.
Figure 11B:
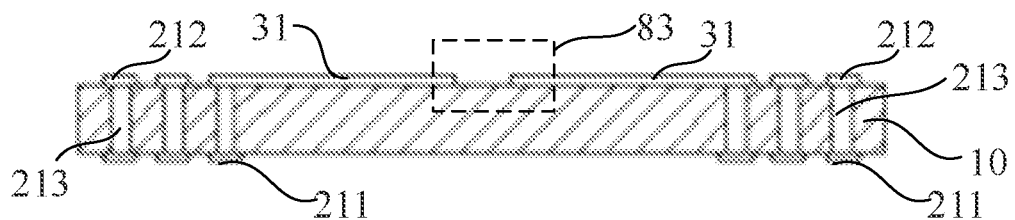
FIG. 11b is a schematic diagram of a structure formed in step S22 in another method for manufacturing a tunable filter according to the embodiment of the present disclosure.

S22, forming first sub-structures 211 of a coil of an inductor L on a first surface of the glass substrate 10 after the step S21, forming second sub-structures 212, a first plate 31 of a third capacitor C3, a first plate 31 of a fourth capacitor C4, a source electrode and a drain electrode 81 of a first switching transistor T1, a source electrode and a drain electrode 82 of a second switching transistor T2, a source electrode and a drain electrode 83 of a third switching transistor T3, and first connection electrodes 213 in the first connecting vias 11 on a second surface, as shown in FIGS. 11*a* and 11*b*.

In some examples, step S22 may be the same as the process of the step S12, except that the first plate 31 of the third capacitor C3, the first plate 31 of the fourth capacitor C4, the source electrode and drain electrode 81 of the first switching transistor T1, the source electrode and drain electrode 82 of the second switching transistor T2, and the source electrode and drain electrode 83 of the third switching transistor T3 are formed while the second sub-structures 212 are formed on the second surface. The detailed process steps of step S22 are not repeated.

Figure 12A:
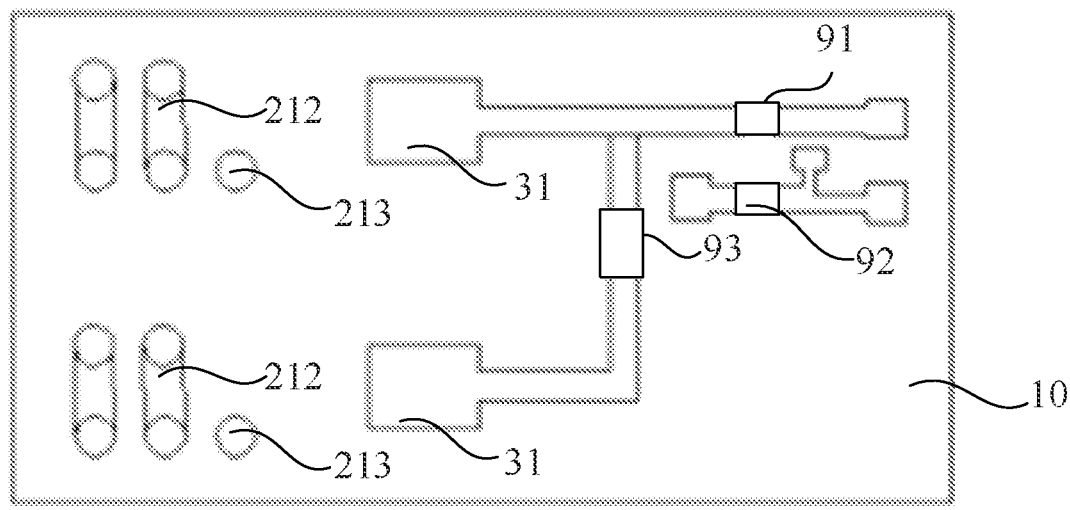
FIG. 12a is a layout formed in step S23 in another method for manufacturing a tunable filter according to the embodiment of the present disclosure.
Figure 12B:
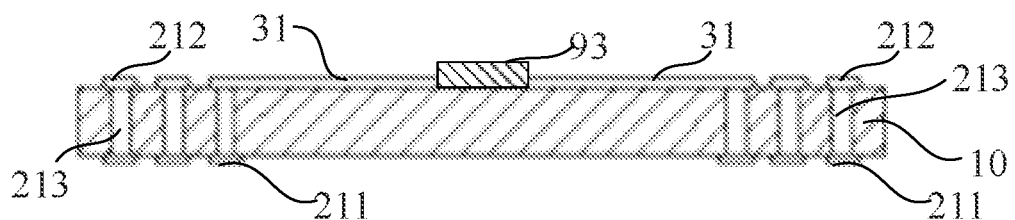
FIG. 12b is a schematic diagram of a structure formed in step S23 in another method for manufacturing a tunable filter according to the embodiment of the present disclosure.

S23, forming an active layer 91 of the first switching transistor T1, an active layer 92 of the second switching transistor T2 and an active layer 93 of the third switching transistor T3 on the glass substrate 10 after the step S22, as shown in FIGS. 12*a* and 12*b*, and forming a second interlayer dielectric layer on a side of the active layer 91 of the first switching transistor T1, the active layer 92 of the second switching transistor T2 and the active layer 93 of the third switching transistor T3 away from the glass substrate 10.

It should be noted that the second interlayer dielectric layer is used as an intermediate medium between the first plate 31 and the second plate of the third capacitor C3, and is also used as an intermediate medium between the first plate 31 and the second plate of the fourth capacitor C4, so the second interlayer dielectric layer may be only provided at the positions where the first plate 31 of the third capacitor C3 and the first plate 31 of the fourth capacitor C4 are located. Alternatively, the second interlayer dielectric layer may cover the active layer 91 of the first switching transistor T1, the active layer 92 of the second switching transistor T2, the active layer 93 of the third switching transistor T3, the first plate 31 of the third capacitor C3, and the first plate 31 of the fourth capacitor C4, so that it is not necessary to form an interlayer insulating layer on a side of the active layer 91 of the first switching transistor T1, the active layer 92 of the second switching transistor T2, and the active layer 93 of the third switching transistor T3 away from the glass substrate 10. In the embodiment of the present disclosure, as an example, the second interlayer dielectric layer may also cover the active layer 91 of the first switching transistor T1, the active layer 92 of the second switching transistor T2, the active layer 93 of the third switching transistor T3, and the first plate 31 of the third capacitor C3, and the first plate 31 of the fourth capacitor C4.

In some examples, step S23 may include depositing a semiconductor material layer through a plasma chemical vapor deposition method, performing photoresist coating on the semiconductor material layer, exposure and development, then performing dry etching, and removing the photoresist by stripping, so as to obtain a pattern including the active layer 91 of the first switching transistor T1, the active layer 92 of the second switching transistor T2, and the active layer 93 of the third switching transistor T3. Then, a second interlayer dielectric layer is deposited through a plasma chemical vapor deposition. A material of the semiconductor material layer includes, but is not limited to, metal oxide, polysilicon, amorphous silicon, or the like. A material of the second interlayer dielectric layer may be the same as that of the first interlayer dielectric layer 40.

S24, forming a gate electrode of the first switching transistor T1, a gate electrode of the second switching transistor T2, a gate electrode 103 of the third switching transistor T3, a second plate 32 of the third capacitor C3, and a second plate 32 of the fourth capacitor C4 on the glass substrate 10 after the step S23. In some examples, in step S24, a fourth metal film may be deposited by magnetron sputtering, and then photoresist coating, exposure, and development are performed, followed by wet etching, and the photoresist is removed by stripping, so as to form a pattern including the gate electrode of the first switching transistor T1, the gate electrode of the second switching transistor T2, the gate electrode 103 of the third switching transistor T3, the second plate 32 of the third capacitor C3, and the second plate 32 of the fourth capacitor C4; as shown in FIGS. 9a and 9b.

A material of the fourth metal film may be the same as that of the first metal film, and thus, the description thereof is not repeated.

S25, forming a first interlayer dielectric layer 40 on the glass substrate 10 after the step S24, and forming a sixth connecting via, a seventh connecting via, an eighth connecting via, a ninth connecting via and a tenth connecting via. The sixth connecting via is used for connecting the signal input terminal Input to be formed to the first lead terminal 22 of the first inductor L1; the seventh connecting via is used for connecting the first signal output terminal Output1 to be formed to the second plate 32 of the third capacitor C3; the eighth connecting via is used for connecting the second signal input terminal Input to be formed to the first lead terminal 22 of the second inductor L2; the ninth connecting via is used for connecting the first control signal terminal to be formed to the gate electrode of the first switching transistor T1; the tenth connecting via is used for connecting the second control signal terminal to be formed to the gate electrode of the second switching transistor T2 and the gate electrode 103 of the third switching transistor T3.

In some examples, step S25 may include forming the first interlayer dielectric layer 40 on a side of the second plate 32 of the second capacitor C2 away from the glass substrate 10 through a plasma enhanced chemical vapor deposition (PECVD), then performing photoresist coating on the first interlayer dielectric layer 40, exposure and development, then performing dry etching, removing the photoresist by stripping after etching, to obtain the sixth connecting via, the seventh connecting via, the eighth connecting via, the ninth connecting via, and the tenth connecting via.

The first interlayer dielectric layer 40 is made of an inorganic insulating material. For example: the first interlayer dielectric layer 40 is an inorganic insulating layer formed of silicon nitride (SiNx), or an inorganic insulating layer formed of silicon oxide (SiO$_2$), or a stacked and combined layer including the SiNx inorganic insulating layer and SiO$_2$ inorganic insulating layer.

S26, forming a signal input terminal Input, a first signal output terminal Output1, a second signal output terminal Output2, a first control signal terminal and a second control signal terminal on the glass substrate 10 after the step S25; the signal input terminal Input is connected to the first lead terminal 22 of the first inductor L1 through the sixth connecting via extending through the first interlayer dielectric layer 40; the first signal output terminal Output1 is connected to the second plate 32 of the third capacitor C3 through the seventh connecting via extending through the first interlayer dielectric layer 40; the second signal output terminal Output2 is connected to the first lead terminal 22 of the second inductor L2 through the eighth connecting via extending through the first interlayer dielectric layer 40; the first control signal terminal is connected to the gate electrode of the first switching transistor T1 through the ninth connecting via extending through the first interlayer dielectric layer 40; the second control signal terminal is connected to the gate electrode of the second switching transistor T2 and the gate electrode 103 of the third switching transistor T3 through the tenth connecting via extending through the first interlayer dielectric layer 40, as shown in FIGS. 9a and 9b.

In some examples, step S15 may include depositing a third metal film by magnetron sputtering, performing photoresist coating, exposure, development, performing wet etching, and removing the photoresist by stripping after etching, to form a pattern including the signal input terminal Input, the first signal output terminal Output1, the second signal output terminal Output2, the first control signal terminal, and the second control signal terminal. A material of the third metal film may be the same as that of the first metal film, and thus is not described herein again.

S27, forming a fifth connection pad 55, a sixth connection pad 56, a seventh connection pad 57, an eighth connection pad 58 and a ninth connection pad 59 on the glass substrate 10 after the step S26, as shown in FIGS. 9a and 9b. The fifth connection pad 55 covers a side of the signal input terminal Input away from the base substrate; the sixth connection pad 56 covers a side of the first signal output terminal Output1 away from the base substrate; the seventh connection pad 57 covers a side of the second signal output terminal Output2 away from the base substrate; the eighth connection pad 58 covers a side of the first control signal terminal away from the base substrate; the ninth connection pad 59 covers a side of the second control signal terminal away from the base substrate.

In some examples, the fifth connection pad 55, the sixth connection pad 56, the seventh connection pad 57, the eighth connection pad 58, and the ninth connection pad 59 include, but are not limited to, solder.

The preparation of the tunable filter shown in FIG. 8 is completed.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. A tunable filter, comprising:
a base substrate having a first surface and a second surface opposite to each other in a thickness direction of the base substrate; wherein the base substrate is provided with first connecting vias extending through the base substrate along the thickness direction of the base substrate; and
at least one inductor and at least one capacitor on the base substrate; wherein each of the at least one inductor comprises first sub-structures on the first surface, second sub-structures on the second surface, and first connection electrodes in the first connecting vias, and the first sub-structures are connected to the second sub-structures by the first connection electrodes, respectively;
wherein the at least one capacitor comprises a first capacitor and a second capacitor; the at least one inductor comprises one inductor; and
a first lead terminal of the inductor is connected to a first signal terminal, and a second lead terminal of the inductor is connected to a second signal terminal and a first plate of the first capacitor; a second plate of the first capacitor is connected to a second plate of the second capacitor and a first bias voltage terminal; and a first plate of the second capacitor is connected to a second bias voltage terminal.

2. The tunable filter of claim 1, wherein the first plate and the second plate of the second capacitor are sequentially arranged along a direction away from the base substrate, and the second capacitor further comprises a P-type semiconductor layer, an intrinsic semiconductor layer and an N-type semiconductor layer stacked between the first plate and the second plate.

3. The tunable filter of claim 2, further comprising a first interlayer dielectric layer on a side of the second plate of the second capacitor away from the base substrate, wherein the first signal terminal, the second signal terminal, the first bias voltage terminal, and the second bias voltage terminal are arranged on a side of the first interlayer dielectric layer away from the base substrate; and
the first signal terminal is connected to the first lead terminal of the inductor through a second connecting via extending through the first interlayer dielectric layer; the second signal terminal is connected to the second plate of the second capacitor through a third connecting via extending through the first interlayer dielectric layer; the first bias voltage terminal is connected to the second plate of the second capacitor through a fourth connecting via extending through the first interlayer dielectric layer; and the second bias voltage terminal is connected to the first plate of the second capacitor through a fifth connecting via extending through the first interlayer dielectric layer.

4. The tunable filter of claim 3, further comprising a fifth connection pad, a sixth connection pad, a seventh connection pad, an eighth connection pad, and a ninth connection pad on a side of a layer, where the third signal terminal, the fourth signal terminal, the fifth signal terminal, the first control signal terminal, and the second control signal terminal are located, away from the base substrate; and
the fifth connection pad covers a side of the third signal terminal away from the base substrate; the sixth connection pad covers a side of the fourth signal terminal away from the base substrate; the seventh connection pad covers a side of the fifth signal terminal away from the base substrate; the eighth connection pad covers a side of the first control signal terminal away from the base substrate; and the ninth connection pad covers a side of the second control signal terminal away from the base substrate.

5. The tunable filter of claim 3, further comprising a first connection pad, a second connection pad, a third connection pad, and a fourth connection pad on a side of a layer, where the first signal terminal, the second signal terminal, the first bias voltage terminal, and the second bias voltage terminal are located, away from the base substrate; and
the first connection pad covers a side of the first signal terminal away from the base substrate; the second connection pad covers a side of the second signal terminal away from the base substrate; the third connection pad covers a side of the first bias voltage terminal away from the base substrate; the fourth connection pad covers a side of the second bias voltage terminal away from the base substrate.

6. The tunable filter of claim 2, wherein the second sub-structures of the inductor, the first plate of the first capacitor, and the first plate of the second capacitor are arranged in a same layer and are made of a same material; and/or
the first plate of the first capacitor and the second plate of the second capacitor are arranged in a same layer and made of a same material.

7. The tunable filter of claim 6, further comprising a first interlayer dielectric layer on a side of the second plate of the second capacitor away from the base substrate, wherein the first signal terminal, the second signal terminal, the first bias voltage terminal, and the second bias voltage terminal are arranged on a side of the first interlayer dielectric layer away from the base substrate; and
the first signal terminal is connected to the first lead terminal of the inductor through a second connecting via extending through the first interlayer dielectric layer; the second signal terminal is connected to the second plate of the second capacitor through a third connecting via extending through the first interlayer dielectric layer; the first bias voltage terminal is connected to the second plate of the second capacitor through a fourth connecting via extending through the first interlayer dielectric layer; and the second bias voltage terminal is connected to the first plate of the second capacitor through a fifth connecting via extending through the first interlayer dielectric layer.

8. The tunable filter of claim 7, further comprising a first connection pad, a second connection pad, a third connection pad, and a fourth connection pad on a side of a layer, where the first signal terminal, the second signal terminal, the first bias voltage terminal, and the second bias voltage terminal are located, away from the base substrate; and the first connection pad covers a side of the first signal terminal away from the base substrate; the second connection pad covers a side of the second signal terminal away from the base substrate; the third connection pad covers a side of the first bias voltage terminal away from the base substrate; the fourth connection pad covers a side of the second bias voltage terminal away from the base substrate.

9. The tunable filter of claim 7, further comprising a fifth connection pad, a sixth connection pad, a seventh connection pad, an eighth connection pad, and a ninth connection pad on a side of a layer, where the third signal terminal, the fourth signal terminal, the fifth signal terminal, the first control signal terminal, and the second control signal terminal are located, away from the base substrate; and the fifth connection pad covers a side of the third signal terminal away from the base substrate; the sixth connection pad covers a side of the fourth signal terminal away from the base substrate; the seventh connection pad covers a side of the fifth signal terminal away from the base substrate; the eighth connection pad covers a side of the first control signal terminal away from the base substrate; and the ninth connection pad covers a side of the second control signal terminal away from the base substrate.

10. The tunable filter of claim 1, wherein the base substrate comprises a glass substrate.

11. A method for manufacturing the tunable filter of claim 1, comprising:

preparing a base substrate such that the base substrate is provided with a first surface and a second surface opposite to each other in a thickness direction of the base substrate and the base substrate is provided with first connecting vias extending through the base substrate along the thickness direction of the base substrate; and forming at least one inductor and at least one capacitor on the base substrate; wherein forming each of the at least one inductor comprises:
forming first sub-structures of the inductor on the first surface, second sub-structures of the inductor on the second surface, and first connection electrodes in the first connecting vias such that the first sub-structures are respectively connected to the second sub-structures by the first connection electrodes, to form a coil structure of the inductor.

12. The method of claim 11, wherein the first plate and the second plate of the second capacitor are sequentially arranged along a direction away from the base substrate, and the second capacitor further comprises a P-type semiconductor layer, an intrinsic semiconductor layer and an N-type semiconductor layer stacked between the first plate and the second plate.

13. The method of claim 12, wherein the second sub-structures of the inductor, the first plate of the first capacitor, and the first plate of the second capacitor are arranged in a same layer and are made of a same material; and/or the first plate of the first capacitor and the second plate of the second capacitor are arranged in a same layer and made of a same material.

14. The method of claim 12, further comprising a first interlayer dielectric layer on a side of the second plate of the second capacitor away from the base substrate, wherein the first signal terminal, the second signal terminal, the first bias voltage terminal, and the second bias voltage terminal are arranged on a side of the first interlayer dielectric layer away from the base substrate; and the first signal terminal is connected to the first lead terminal of the inductor through a second connecting via extending through the first interlayer dielectric layer; the second signal terminal is connected to the second plate of the second capacitor through a third connecting via extending through the first interlayer dielectric layer; the first bias voltage terminal is connected to the second plate of the second capacitor through a fourth connecting via extending through the first interlayer dielectric layer; and the second bias voltage terminal is connected to the first plate of the second capacitor through a fifth connecting via extending through the first interlayer dielectric layer.

15. The method of claim 14, further comprising a first connection pad, a second connection pad, a third connection pad, and a fourth connection pad on a side of a layer, where the first signal terminal, the second signal terminal, the first bias voltage terminal, and the second bias voltage terminal are located, away from the base substrate; and the first connection pad covers a side of the first signal terminal away from the base substrate; the second connection pad covers a side of the second signal terminal away from the base substrate; the third connection pad covers a side of the first bias voltage terminal away from the base substrate; the fourth connection pad covers a side of the second bias voltage terminal away from the base substrate.

16. A tunable filter, comprising:

a base substrate having a first surface and a second surface opposite to each other in a thickness direction of the base substrate; wherein the base substrate is provided with first connecting vias extending through the base substrate along the thickness direction of the base substrate; and at least one inductor and at least one capacitor on the base substrate; wherein each of the at least one inductor comprises first sub-structures on the first surface, second sub-structures on the second surface, and first connection electrodes in the first connecting vias, and the first sub-structures are connected to the second sub-structures by the first connection electrodes, respectively, wherein the at least one inductor comprises a first inductor and a second inductor; the at least one capacitor comprises a third capacitor and a fourth capacitor;

the tunable filter comprises a first resonant unit, a second resonant unit, a first switching transistor, a second switching transistor and a third switching transistor; wherein the first resonant unit comprises the first inductor and the third capacitor; the second resonant unit comprises the second inductor and the fourth capacitor; and a first lead terminal of the first inductor is connected to a third signal terminal, and a second lead terminal of the first inductor is connected to a first plate of the third capacitor; a second plate of the third capacitor is connected to a first electrode of the first switching transistor; a second electrode of the first switching transistor is connected to a fourth signal terminal; a control electrode of the first switching transistor is connected to a first control signal terminal and a first electrode of the second switching transistor; a second electrode of the second switching transistor is connected to a reference voltage terminal; a control electrode of the second switching transistor is connected to a second control signal terminal and a control electrode of the third switching transistor; a first electrode of the third switching transistor is connected to the second plate of the third capacitor; a second electrode of the third switching transistor is connected to a second plate of the fourth capacitor; a first plate of the fourth capacitor is connected to a second lead terminal of the second inductor; and a first lead terminal of the second inductor is connected to a fifth signal terminal.

17. The tunable filter of claim 16, wherein second sub-structures of the first inductor, second sub-structures of the second inductor, the first plate of the third capacitor, the first plate of the fourth capacitor, the first and second electrodes of the first switching transistor, the first and second electrodes of the second switching transistor, and the first and second electrodes of the third switching transistor are arranged in a same layer and are made of a same material; and/or the second plate of the third capacitor, the second plate of the fourth capacitor, the control electrode of the first switching transistor, the control electrode of the second switching transistor and the control electrode of the third switching transistor are arranged in a same layer and are made of a same material.

18. The tunable filter of claim 17, further comprising a first interlayer dielectric layer on a side of the second plate of the second capacitor away from the base substrate, and wherein the third signal terminal, the fourth signal terminal, and the fifth signal terminal and the first control signal terminal and the second control signal terminal are arranged on a side of the first interlayer dielectric layer away from the base substrate; and the third signal terminal is connected to the first lead terminal of the first inductor through a sixth connecting via extending through the first interlayer dielectric layer; the fourth signal terminal is connected to the second plate of the third capacitor through a seventh connecting via extending through the first interlayer dielectric layer; the fifth signal terminal is connected to the first lead terminal of the second inductor through an eighth connecting via extending through the first interlayer dielectric layer; the first control signal terminal is connected to the control electrode of the first switching transistor through a ninth connecting via extending through the first interlayer dielectric layer; and the second control signal terminal is connected to the control electrode of the second switching transistor and the control electrode of the third switching transistor through a tenth connecting via extending through the first interlayer dielectric layer.

19. The tunable filter of claim 16, further comprising a first interlayer dielectric layer on a side of the second plate of the second capacitor away from the base substrate, and wherein the third signal terminal, the fourth signal terminal, and the fifth signal terminal and the first control signal terminal and the second control signal terminal are arranged on a side of the first interlayer dielectric layer away from the base substrate; and the third signal terminal is connected to the first lead terminal of the first inductor through a sixth connecting via extending through the first interlayer dielectric layer; the fourth signal terminal is connected to the second plate of the third capacitor through a seventh connecting via extending through the first interlayer dielectric layer; the fifth signal terminal is connected to the first lead terminal of the second inductor through an eighth connecting via extending through the first interlayer dielectric layer; the first control signal terminal is connected to the control electrode of the first switching transistor through a ninth connecting via extending through the first interlayer dielectric layer; and the second control signal terminal is connected to the control electrode of the second switching transistor and the control electrode of the third switching transistor through a tenth connecting via extending through the first interlayer dielectric layer.

20. A method for manufacturing the tunable filter of claim 16, comprising:

preparing a base substrate such that the base substrate is provided with a first surface and a second surface opposite to each other in a thickness direction of the base substrate and the base substrate is provided with first connecting vias extending through the base substrate along the thickness direction of the base substrate; and forming at least one inductor and at least one capacitor on the base substrate; wherein forming each of the at least one inductor comprises:

forming first sub-structures of the inductor on the first surface, second sub-structures of the inductor on the second surface, and first connection electrodes in the first connecting vias such that the first sub-structures are respectively connected to the second sub-structures by the first connection electrodes, to form a coil structure of the inductor.

* * * * *